US009526175B2

(12) United States Patent
Manusharow et al.

(10) Patent No.: US 9,526,175 B2
(45) Date of Patent: Dec. 20, 2016

(54) SUSPENDED INDUCTOR MICROELECTRONIC STRUCTURES

(75) Inventors: Mathew J. Manusharow, Phoenix, AZ (US); Mihir K. Roy, Chandler, AZ (US); Kaladhar Radhakrishnan, Gilbert, AZ (US); Debendra Mallik, Chandler, AZ (US); Edward A. Burton, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 177 days.

(21) Appl. No.: 13/996,830

(22) PCT Filed: Apr. 24, 2012

(86) PCT No.: PCT/US2012/034798
§ 371 (c)(1),
(2), (4) Date: May 28, 2014

(87) PCT Pub. No.: WO2013/162519
PCT Pub. Date: Oct. 31, 2013

(65) Prior Publication Data
US 2014/0251669 A1 Sep. 11, 2014

(51) Int. Cl.
*H05K 1/18* (2006.01)
*H05K 1/14* (2006.01)
(Continued)

(52) U.S. Cl.
CPC .............. *H05K 1/183* (2013.01); *H01L 23/13* (2013.01); *H05K 1/111* (2013.01); *H05K 1/141* (2013.01);
(Continued)

(58) Field of Classification Search
CPC ........ H05K 1/183; H05K 1/141; H05K 1/142; H05K 3/4697
See application file for complete search history.

(56) References Cited

U.S. PATENT DOCUMENTS 4,704,592 A * 11/1987 Marth et al. .................... 336/83
6,423,570 B1   7/2002 Ma et al.
(Continued)

FOREIGN PATENT DOCUMENTS

| JP | 2010-523001 A | 7/2010 |
| WO | 2013/137710 A1 | 9/2013 |
| WO | 2013/162519 A1 | 10/2013 |

OTHER PUBLICATIONS

International Preliminary Report on Patentability and Written Opinion received for PCT Patent Application No. PCT/MY2012/000055, mailed on Sep. 25, 2014, 8 Pages.
(Continued)

*Primary Examiner* — Jeremy C Norris
(74) *Attorney, Agent, or Firm* — Winkle, PLLC (57) ABSTRACT

The present description relates to the field of fabricating microelectronic structures. The microelectronic structure may include a microelectronic substrate have an opening, wherein the opening may be formed through the microelectronic substrate or may be a recess formed in the microelectronic substrate. A microelectronic package may be attached to the microelectronic substrate, wherein the microelectronic package may include an interposer having a first surface and an opposing second surface. A microelectronic device may be attached to the interposer first surface and the interposer may be attached to the microelectronic substrate by the interposer first surface such that the microelectronic device extends into the opening. At least one secondary microelectronic device may be attached to the interposer second surface.

14 Claims, 5 Drawing Sheets

(51) Int. Cl.
*H01L 23/13* (2006.01)
*H05K 1/11* (2006.01)
*H01L 23/50* (2006.01)

(52) U.S. Cl.
CPC ...... *H01L 23/50* (2013.01); *H01L 2224/16225* (2013.01); *H01L 2924/15311* (2013.01); *H01L 2924/19104* (2013.01); *H01L 2924/19106* (2013.01); *H05K 2201/1003* (2013.01)

(56) References Cited

U.S. PATENT DOCUMENTS

| | | |
|---|---|---|
| 2004/0060732 A1 | 4/2004 | Giri et al. |
| 2006/0214745 A1 | 9/2006 | Park et al. |
| 2008/0002380 A1 | 1/2008 | Hazucha et al. |
| 2008/0007925 A1 | 1/2008 | Kariya et al. |
| 2008/0150110 A1 | 6/2008 | Kim |
| 2008/0237789 A1 | 10/2008 | He et al. |
| 2011/0203836 A1* | 8/2011 | Yokota et al. ............... 174/250 |
| 2011/0210444 A1 | 9/2011 | Jeng et al. |
| 2014/0293563 A1 | 10/2014 | Loo et al. |

OTHER PUBLICATIONS

International Preliminary Report on Patentability and Written Opinion received for PCT Patent Application No. PCT/US2012/034798, mailed on Nov. 6, 2014, 6 pages.

International Search Report and Written Opinion for PCT Patent Application No. PCT/MY2012/000055, mailed on Nov. 23, 2012, 11 pages.

International Search Report and Written Opinion received for PCT Patent Application No. PCT/US2012/34798, mailed on Dec. 14, 2012, 9 pages.

* cited by examiner

SUSPENDED INDUCTOR MICROELECTRONIC STRUCTURES

TECHNICAL FIELD

Embodiments of the present description generally relate to the field of microelectronic structures and, more particularly, to the integration of air core inductors in microelectronic structures.

BACKGROUND ART

The microelectronic industry is continually striving to produced ever smaller, thinner, and lighter microelectronic structures for use in various mobile electronic products, such as portable computers, electronic tablets, cellular phones, digital cameras, and the like. Typically, a microelectronic device, such a microprocessor, a chipset, a graphics device, a wireless device, a memory device, an application specific integrated circuit, or the like, and microelectronic components, such as resistor, capacitors, and inductors, is attached to a microelectronic substrate, which enables electrical communication between the microelectronic device, the microelectronic components, and external devices. However, as the thickness of microelectronic structures decreases, electromagnetic coupling between magnetic fields (e.g. B fields) of inductors, such as air core inductors, mounted on the microelectronic substrate, and output voltage planes, within the microelectronic substrate, becomes greater, which can significantly reduce the efficiency of the inductors. This, in turn, can lead to power loss, ultimately resulting in an inefficient system that can put unnecessary power drain on microelectronic devices, as will be understood to those skilled in the art.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF THE EMBODIMENTS

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description may include an inductor suspended from a microelectronic package rather than mounting the inductors on the microelectronic substrate. In one embodiment, the suspension of the inductor may be facilitated by an opening in a microelectronic substrate, wherein the opening may be formed through the microelectronic substrate or may be a recess formed in the microelectronic substrate. Thus, when the microelectronic package is attached to the microelectronic substrate, the inductor extends into the opening. In another embodiment, the suspension of the inductor may be facilitated by an opening in a socket, such as a pin grid array socket or a land grid array socket. Thus, when the microelectronic package is attached to the socket, the inductor extends into the socket opening.

Embodiments of the present description may utilize air core inductors. An inductor is a passive electrical component that stores energy in a magnetic field generated by a magnetic core. The term air core inductor is used to describe an inductor having coils that do not use a magnetic core made of ferromagnetic materials. Rather, the coils are wound on non-magnetic material, such as plastic, ceramics, and the like, and may have air inside the windings, as will be understood to those skilled in the art.

The embodiments of the present description may mitigate issues associated with the incorporation of inductors, such as air core inductors, in microelectronic structures. The embodiments of the present description may enable the use of air core inductors on very thin microelectronics devices, such as ultrathin core packages, coreless packages, bumpless build-up layer (BBUL) packages, and the like, by eliminating or substantially reducing electromagnetic coupling between magnetic fields of air core inductors mounted on the microelectronic substrate and output voltage planes within the microelectronic substrate. Furthermore, embodiments of the present description may also eliminate or substantially reduce noise issues associated with inductors in a microelectronic device. Moreover, embodiments of the present description eliminate microelectronic substrate warpage caused by the attachment of inductors to the microelectronic substrate, as the inductor is attached to the microelectronic package rather than the microelectronic substrate.

Figure 1:
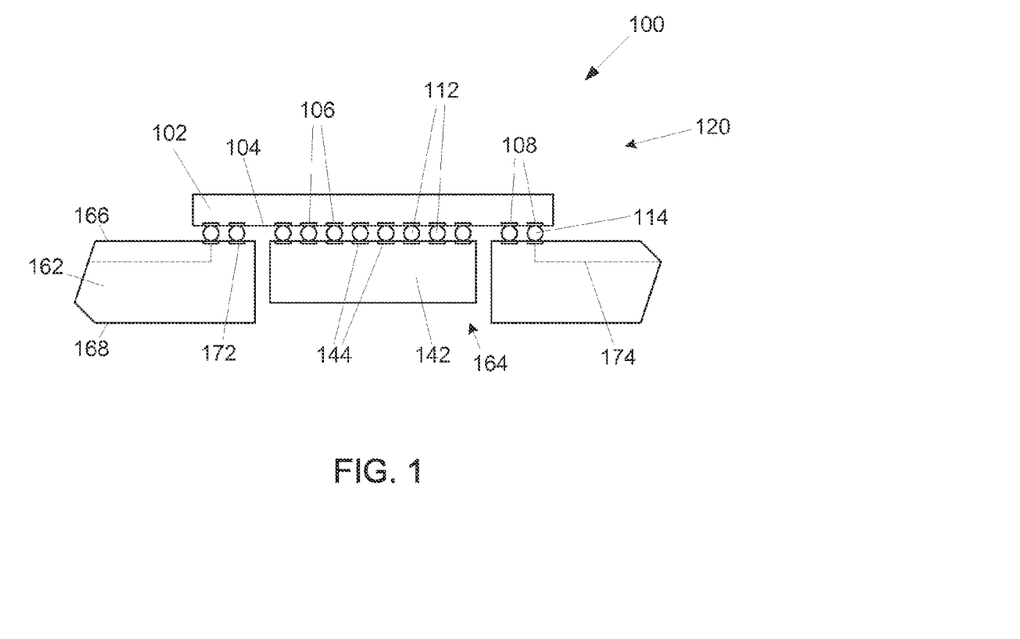
FIG. 1 illustrates a side cross-sectional view of a microelectronic package having an inductor, wherein the microelectronic package is mounted on a microelectronic substrate such that the inductor extends to an opening in the microelectronic substrate, according to one embodiment of the present description.

In one embodiment of a microelectronic structure of the present description illustrated in FIG. 1, a microelectronic device 102, such as a microprocessor, a chipset, a graphics device, a wireless device, a memory device, an application specific integrated circuit, or the like, may have an inductor 142, such as an air core inductor, attached to a first surface 104 of the microelectronic device 102 through a plurality of interconnects 112, to form a microelectronic package 120. The device-to-inductor interconnects 112 may extend between first bond pads 106 on a microelectronic device first surface 104 and substantially mirror-image bond pads 144 on the inductor 142. The microelectronic device first bond pads 106 may be in electrical communication with integrated circuitry (not shown) within the microelectronic device 102. As further shown in FIG. 1, an opening 164 may be formed in a microelectronic substrate 162, such as a motherboard. The microelectronic substrate 162 may provide electrical communication routes (illustrated as dashed lines 174, on or within the microelectronic substrate 162) between the microelectronic package 120 and external components (not shown). In one embodiment, the microelectronic substrate opening 164 may extend through the microelectronic substrate 162, as illustrated, from a first surface 166 of the microelectronic substrate 162 to a second surface 168 of the microelectronic substrate 162. The microelectronic package 120 may be mounted on the microelectronic substrate first surface 166 in a configuration such that the inductor 142 extends into the microelectronic substrate opening 164. The microelectronic package 120 may be attached to the microelectronic substrate 162 through a plurality of interconnects 114, to form a microelectronic structure 100. The package-to-substrate interconnects 114 may extend between second bond pads 108 on the microelectronic device first surface 104 and substantially mirror-image bond pads 172 on the microelectronic substrate first surface 166. The microelectronic substrate bond pads 172 may be in electrical communication with the electrically conductive routes 174. The microelectronic device second bond pads 108 may be in electrical communication with integrated circuitry (not shown) within the microelectronic device 102.

The microelectronic substrate 162 may be primarily composed of any appropriate material, including, but not limited to, bismaleimine triazine resin, fire retardant grade 4 material, polyimide materials, glass reinforced epoxy matrix material, and the like, as well as laminates or multiple layers thereof. The microelectronic substrate communication routes 174 may be composed of any conductive material, including but not limited to metals, such as copper and aluminum, and alloys thereof. As will be understood to those skilled in the art, the microelectronic substrate communication routes 174 may be formed as a plurality of conductive traces (not shown) formed on layers of dielectric material (constituting the layers of the microelectronic substrate material), which are connected by conductive vias (not shown).

When solder balls or bumps are used to form the device-to-inductor interconnects 112 and/or the package-to-substrate interconnects 114, the solder may be any appropriate material, including, but not limited to, lead/tin alloys and high tin content alloys (e.g. about 90% or more tin), and similar alloys. The solder may be reflowed, either by heat, pressure, and/or sonic energy. Although the device-to-inductor interconnects 112 are shown as reflowable solder bumps or balls, they may be pins, lands, or wire bonds, as known in the art.

Figure 2:
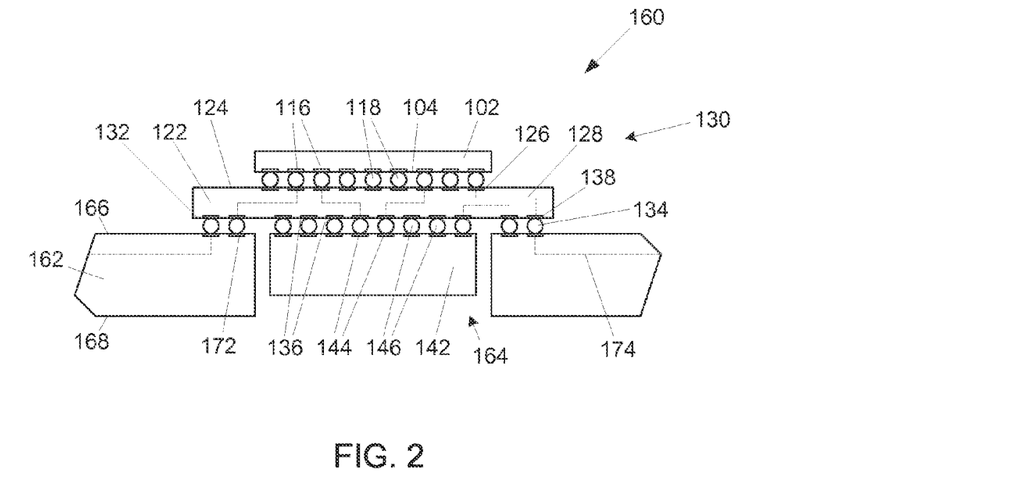
FIG. 2 illustrates a side cross-sectional view of a microelectronic package having an inductor on an interposer, wherein the microelectronic package is mounted on a microelectronic substrate such that the inductor extends to an opening in the microelectronic substrate, according to an embodiment of the present description.

In another embodiment of a microelectronic structure of the present description illustrated in FIG. 2, the microelectronic device 102 may be attached to first surface 124 of a microelectronic interposer 122 through a plurality of interconnects 118. The device-to-interposer interconnects 118 may extend between bond pads 116 on a first surface 104 of the microelectronic device 102 and substantially mirror-image bond pads 126 on the microelectronic interposer first surface 124. The microelectronic device bond pads 116 may be in electrical communication with integrated circuitry (not shown) within the microelectronic device 102. The microelectronic interposer bond pads 126 may be in electrical communication with conductive routes (shown as dashed lines 128) within the microelectronic interposer 122. The microelectronic interposer conductive routes 128 may provide electrical communication routes to first bond pads 136 and to second bond pads 138 on a second surface 132 of the microelectronic interposer 122. The inductor 142, such as an air core inductor, may be attached to the microelectronic interposer second surface 132 through a plurality of interconnects 146. The interposer-to-inductor interconnects 146 may extend between the microelectronic interposer second surface first bond pads 136 and the substantially mirror-image inductor bond pads 144. The interconnection of the microelectronic device 102, the microelectronic interposer 122, the device-to-interposer interconnects 118, the inductor 142, and the inductor-to-interposer interconnects 146 may form a microelectronic package 130.

The microelectronic interposer 122 and its respective conductive routes 128 may be made of multiple layers of conductive traces, such as copper or aluminum, built up on and through dielectric layers, such as epoxy, which are laminated on either side of the matrix core, such as fiberglass or epoxy.

As further shown in FIG. 2, the microelectronic package 130 may be mounted on the microelectronic substrate first surface 166 in a configuration such that the inductor 142 extends into the microelectronic substrate opening 164. The microelectronic package 130 may be attached to the microelectronic substrate 162 through a plurality of interconnects 134, to form a microelectronic structure 160. The interposer-to-substrate interconnects 134 may extend between the microelectronic interposer second surface second bond pads 138 and substantially mirror-image microelectronic substrate bond pads 172

When solder balls or bumps are used to form the device-to-interposer interconnects 118, the interposer-to-inductor interconnects 146, and/or the interposer-to-substrate interconnects 134, the solder may be any appropriate material, including, but not limited to, lead/tin alloys and high tin content alloys (e.g. about 90% or more tin), and similar alloys. The solder may be reflowed, either by heat, pressure, and/or sonic energy. Although the device-to-interposer interconnects 118 and the interposer-to-inductor 146 are shown as reflowable solder bumps or balls, they may be pins, lands, or wire bonds, as known in the art.

Figure 3:
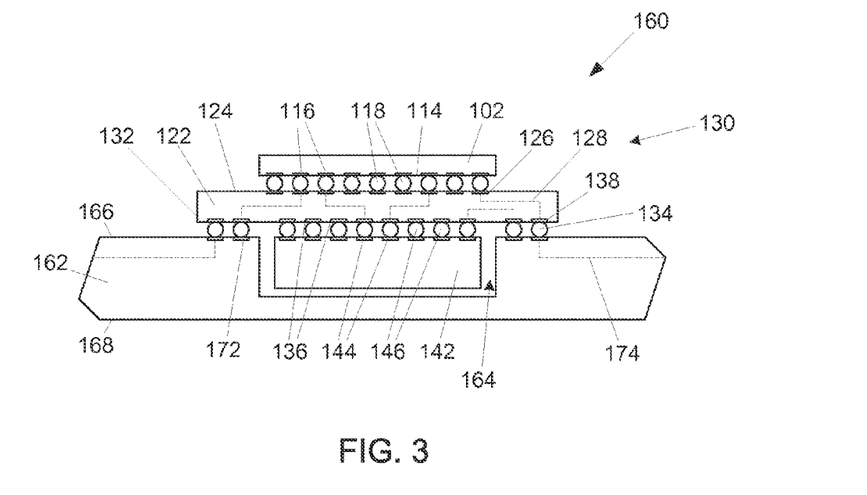
FIG. 3 illustrates a side cross-sectional view of a microelectronic package having an inductor on an interposer, wherein the microelectronic package is mounted on a microelectronic substrate such that the inductor extends to an opening, which is a recess, in the microelectronic substrate, according to an embodiment of the present description.

In another embodiment of the present description shown in FIG. 3, the microelectronic substrate opening 164 may be a recess extending into the microelectronic substrate 162 from the microelectronic substrate first surface 166.

Figure 4:
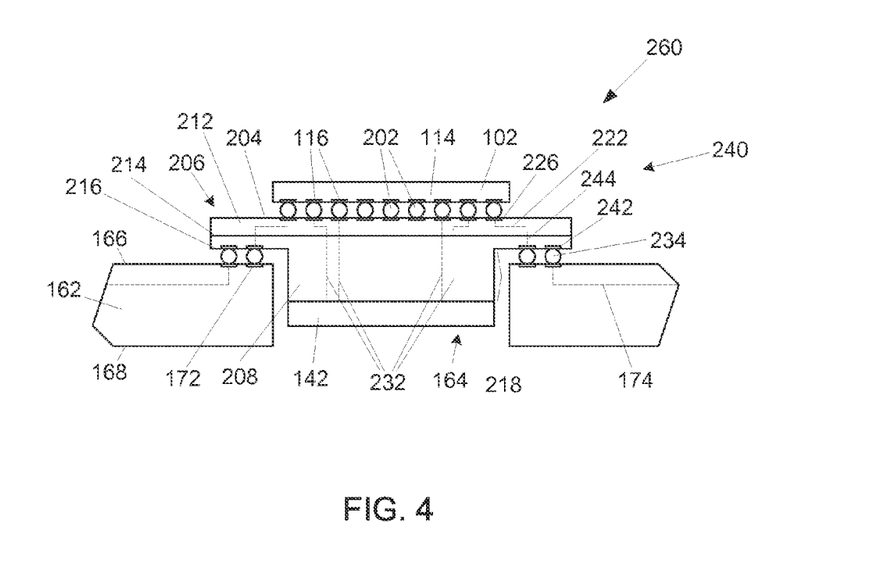
FIG. 4 illustrates a side cross-sectional view of a microelectronic package having an inductor on a cored interposer, wherein the microelectronic package is mounted on a microelectronic substrate such that the inductor extends to an opening in the microelectronic substrate, according to an embodiment of the present description.

In another embodiment of a microelectronic structure of the present description illustrated in FIG. 4, the microelectronic device 102 may be attached to a first surface 204 of a cored microelectronic interposer 206 through a plurality of interconnects 202. The cored microelectronic interposer 206 may comprise a core 208 and a build-up layer 212. The core 208, such as an epoxy material, may be formed (such as by molding or milling) to have a first surface 214 and an opposing second surface 216. A platform portion 218 of the core 208 may extend from the core second surface 216. The build-up layer 212 may be formed on the core first surface 214 and forming the cored microelectronic interposer first surface 204. The build-up layer 212 may be made of multiple layers of conductive traces, such as copper or aluminum, built up on and through dielectric layers, such as epoxy, to form conductive routes 222 that may provide electrical connections between a plurality of bond pads 226 on the build-up layer 212 to the core 208. The device-to-interposer interconnects 202 may extend between the microelectronic device bond pads 116 and the substantially mirror-image build-up layer bond pads 226. The microelectronic device bond pads 116 may be in electrical communication with integrated circuitry (not shown) within the microelectronic device 102.

The inductor 142, such as an air core inductor, may be attached to the core platform portion 218. The inductor 142 may be electrically connected to the build-up layer conductive routes 222 with electrical connections 232, such as plated-through hole vias. The interconnection of the microelectronic device 102, the cored microelectronic interposer 206, the device-to-interposer interconnects 202, and the inductor 142 may form a microelectronic package 240.

As further shown in FIG. 4, the microelectronic package 240 may be mounted on the microelectronic substrate first surface 166 in a configuration such that the inductor 142 extends into the microelectronic substrate opening 164. The microelectronic package 240 may be attached to the microelectronic substrate 162 through a plurality of interconnects 234, to form a microelectronic structure 260. The interposer-to-substrate interconnects 234 may extend between bond pads 242 on the microelectronic interposer second surface 216 and substantially mirror-image bond pads 172 on the microelectronic substrate first surface 166. The microelectronic interposer second surface bond pads 242 may be in electrical communication with may be electrically connected to the build-up layer conductive routes 222 with electrical connections 244.

Figure 5:
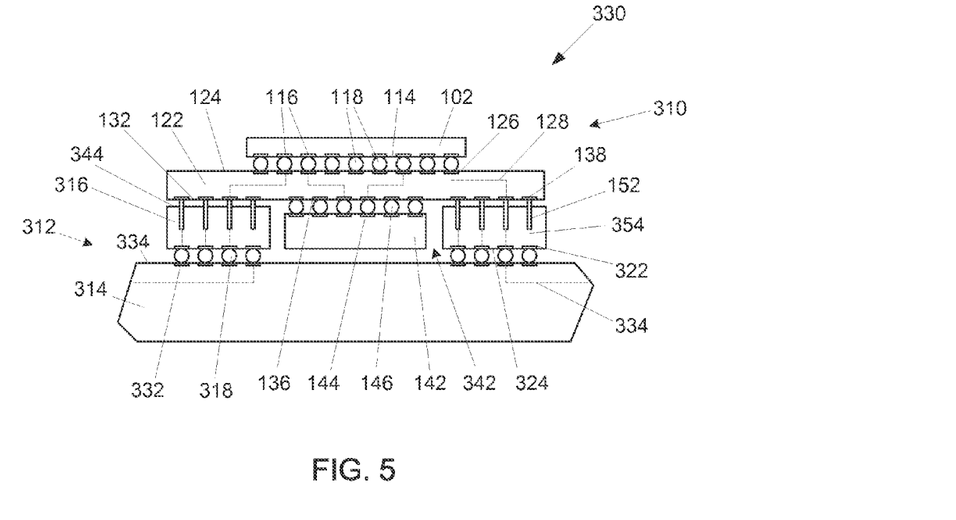
FIG. 5 illustrates a side cross-sectional view of a microelectronic package having an inductor on an interposer, wherein the microelectronic package is mounted on a microelectronic substrate such that the inductor extends to an opening in a socket of the microelectronic substrate, according to an embodiment of the present description.

In another embodiment of a microelectronic structure of the present description illustrated in FIG. 5, the microelectronic device 102 may be attached to the microelectronic interposer first surface 124 through a plurality of interconnects 118. The device-to-interposer interconnects 118 may extend between the microelectronic device bond pads 116 and substantially mirror-image microelectronic interposer bond pads 126. The microelectronic device bond pads 116 may be in electrical communication with integrated circuitry (not shown) within the microelectronic device 102. The microelectronic interposer bond pads 126 may be in electrical communication with conductive routes (shown as dashed lines 128) within the microelectronic interposer 122. The interposer conductive routes 128 may provide electrical communication routes to the first bond pads 136 and to the second bond pads 138 on a second surface 132 of the microelectronic interposer 122. A pin 152 may extend from each of the interposer second surface second bond pads 138. The inductor 142, such as an air core inductor, may be attached to the microelectronic interposer second surface 132 through a plurality of interconnects 146. The interposer-to-inductor interconnects 146 may extend between the microelectronic interposer second surface first bond pads 136 and the substantially mirror-image inductor bond pads 144. The interconnection of the microelectronic device 102, the microelectronic interposer 122, the device-to-interposer interconnects 118, the inductor 142, the inductor-to-interposer interconnects 146, and the pins 152 may form a microelectronic package 310.

As further shown in FIG. 5, a microelectronic substrate 312, such as a motherboard, may be provided, wherein the microelectronic substrate 312 may comprise a microelectronic substrate base 314 and a socket 316, such as a pin grid array socket. The microelectronic substrate socket 316 may be attached to the microelectronic substrate base 314 with a plurality of interconnects 318. The socket-to-base interconnections 318 may extend between bond pads 322 on a second surface 324 of the microelectronic substrate socket 316 and substantially mirror-image bond pads 332 on a first surface 334 of the microelectronic substrate base 314. The microelectronic substrate socket 316 may have an opening 342 therein. In one embodiment, the microelectronic substrate socket opening 342 may extend through the microelectronic substrate socket 316, as illustrated, from a first surface 344 thereof to the second surface 324 thereof. It is understood that the microelectronic substrate socket opening 342 may be a recess, as previously described. The microelectronic package 310 may be mounted on the microelectronic substrate 312 in a configuration such that the inductor 142 extends into the microelectronic substrate socket opening 342 to form a microelectronic structure 330. The microelectronic package 310 may be attached to the microelectronic substrate socket 316 through the microelectronic package pins 152, which are inserted into the microelectronic substrate socket 316, as will be understood to those skilled in the art. The microelectronic substrate socket 316 may include conductive traces 354 that may provide an electrical connection between the microelectronic package pins 152 and the microelectronic substrate socket bond pads 322. The microelectronic substrate 312 may provide electrical communication routes illustrated as dashed lines 334, on or within the microelectronic substrate base 314) between the microelectronic package 310 and external components (not shown).

Figure 6:
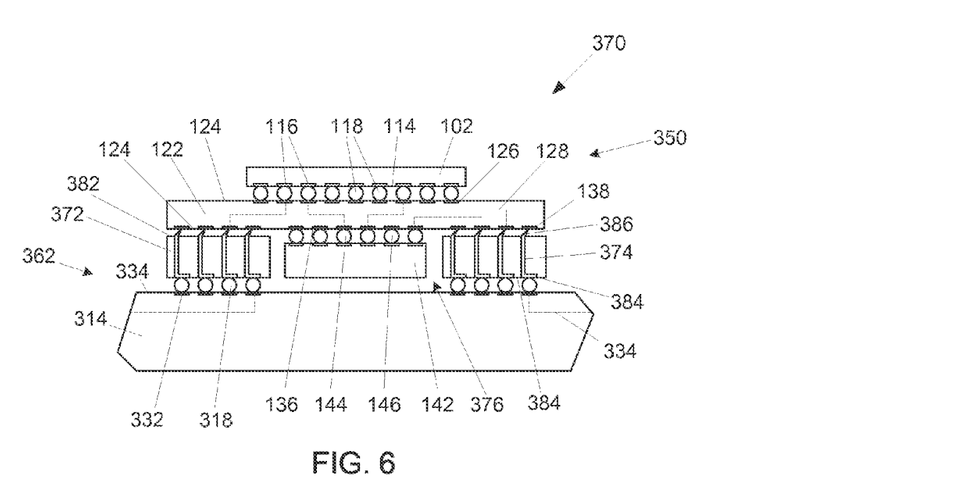
FIG. 6 illustrates a side cross sectional view of a microelectronic package having an inductor on an interposer, wherein the microelectronic package is mounted on a microelectronic substrate such that the inductor extends to an opening in a socket of the microelectronic substrate, according to another embodiment of the present description.

In another embodiment of a microelectronic structure of the present description illustrated in FIG. 6, a microelectronic structure 370 may be formed such as shown for the microelectronic structure 330, wherein the microelectronic structure 370 incorporates a land grid array type socket, rather than a pin grid array type socket. A microelectronic substrate 362 may have a microelectronic substrate socket 372 attached to the microelectronic substrate base 314 with the socket-to-base interconnects 318. The socket-to-base interconnections 318 may extend between conductive structures 374 extending through the microelectronic substrate socket 372 and substantially mirror-image bond pads 332 on a first surface 334 of the microelectronic substrate base 314. The microelectronic substrate socket 372 may have an opening 376 therein. In one embodiment, the microelectronic substrate socket opening 376 may extend through the microelectronic substrate socket 372, as illustrated, from a first surface 382 thereof to the second surface 384 thereof. It is understood that the microelectronic substrate socket opening 376 may be a recess, as previously described.

A microelectronic package 350 may be formed in the manner described for the microelectronic package 310 of FIG. 5 with exception that the microelectronic package 350 does not include the microelectronic package pins 152 of FIG. 5. The microelectronic substrate socket conductive structures 374 may each include a projection 386 that extend from the microelectronic substrate socket first surface 382. The microelectronic substrate socket conductive structure projections 386 may be flexible, as will be understood to those skilled in the art. The microelectronic package 350 may be mounted on the microelectronic substrate 362 in a configuration such that the inductor 142 extends into the microelectronic substrate socket opening 376. The microelectronic package 350 may be electrically connected to the microelectronic substrate 362 by biasing the microelectronic substrate socket conductive structure projections 386 against the microelectronic interposer second surface second bond pads 138 with a biasing mechanism (not shown), as known in the art.

Figure 7:
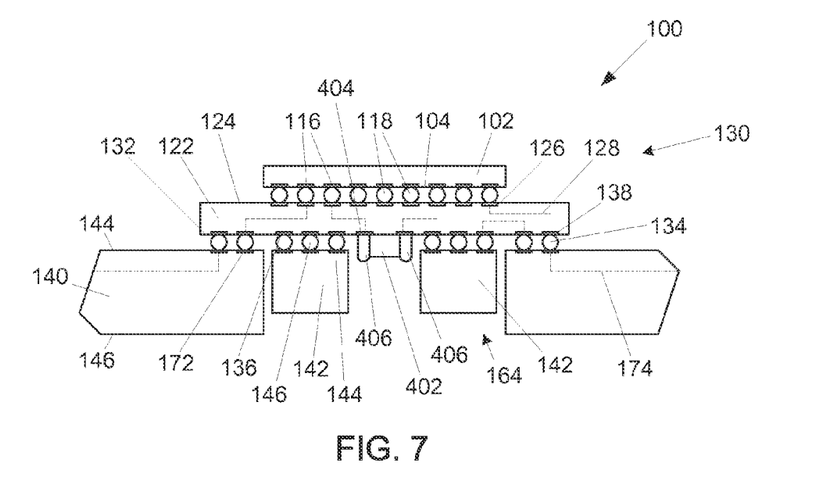
FIG. 7 illustrates a side cross-sectional view of a microelectronic package having at least one inductor on an interposer and a second microelectronic device, wherein the microelectronic package is mounted on a microelectronic substrate such that the inductor(s) and at least one secondary microelectronic device(s) extends to an opening in the microelectronic substrate, according to another embodiment of the present description.

In embodiments of the present description, additional microelectronic devices may be a part of the microelectronic package and attached to also extend into the substrate openings. As shown in FIG. 7, a secondary microelectronic device 402, such as a capacitor, may be attached to third bond pads 404 on microelectronic interposer second surface 132 with interconnects 406. The third bond pads 404 may also be electrical communication with the microelectronic device 102 through the microelectronic interposer conductive routes 128.

Figure 8:
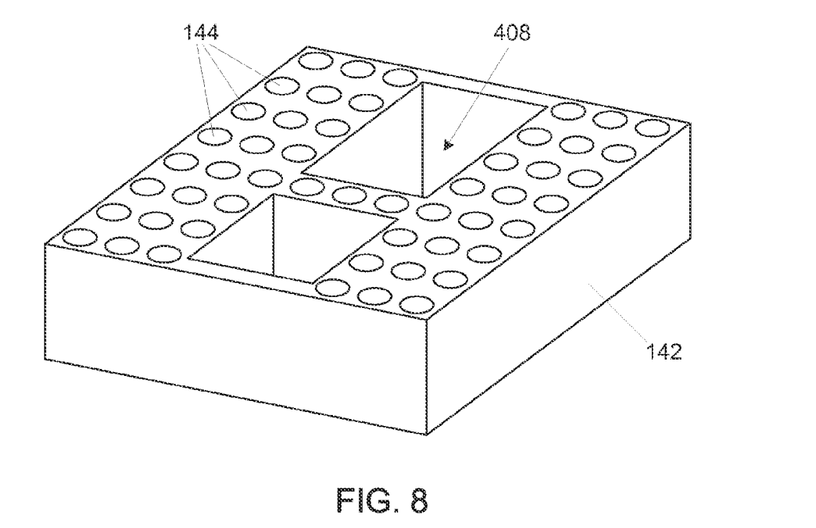
FIG. 8 illustrates an oblique view of an inductor having at least one opening formed therein to accommodate at least one secondary microelectronic device, according to another embodiment of the present description.
Figure 9:
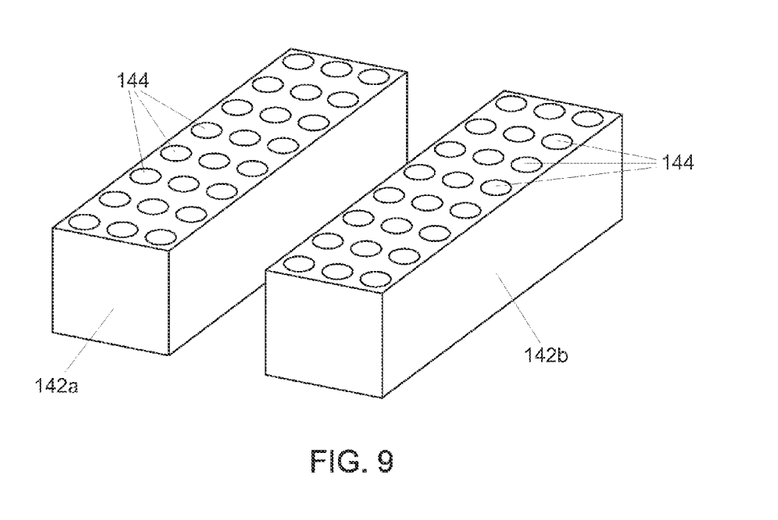
FIG. 9 illustrates an oblique view of a bifurcated inductor to accommodate at least one secondary microelectronic device, according to another embodiment of the present description.

As shown in FIG. 8, the inductor 142 may be specifically fabricated to include at least one opening 408 therein to receive the secondary microelectronic device 402. Additionally, as shown in FIG. 9, the inductor 142 may be split into smaller components. As illustrated the inductor may be at least partially bifurcated into a first bifurcated inductor portion 142a and a second bifurcated inductor portion 142b, such that the secondary microelectronic device 402 may reside between the first bifurcated inductor portion 142a and second bifurcated inductor portion 142b, as shown in FIG. 7.

Figure 10:
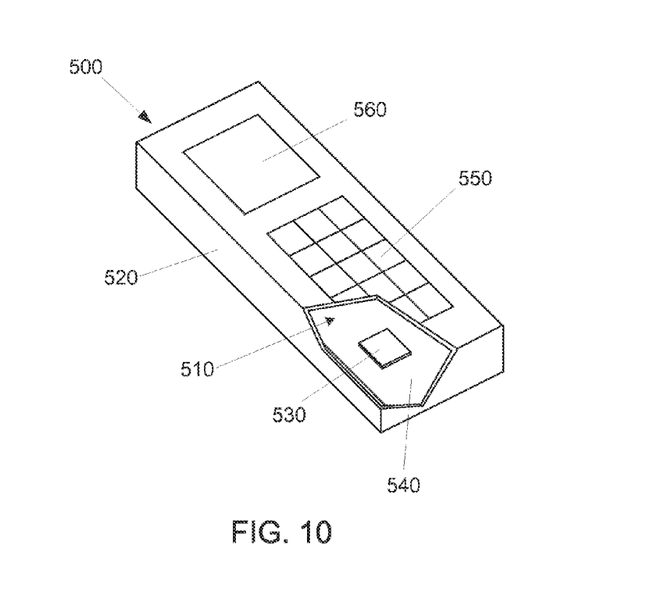
FIG. 10 illustrates an electronic system/device, according to one implementation of the present description.

FIG. 10 illustrates an embodiment of a electronic system/device 500, such as a portable computer, a desktop computer, a mobile telephone, a digital camera, a digital music player, a web tablet/pad device, a personal digital assistant, a pager, an instant messaging device, or other devices. The electronic system/device 500 may be adapted to transmit and/or receive information wirelessly, such as through a wireless local area network (WLAN) system, a wireless personal area network (WPAN) system, and/or a cellular network. The electronic system/device 500 may include a microelectronic structure 510 (such as the microelectronic structures 100, 160, 260, 330, and 370 in FIGS. 1-7) within a housing 520. As with the embodiments of the present application, the microelectronic structure 510 may include a microelectronic substrate 540 having an opening (see microelectronic substrate openings 164, 324 and 376 of FIGS. 1-7) therein and a microelectronic package 530 including a microelectronic inductor (see inductor 142 of FIGS. 1-9), wherein the microelectronic package 530 is electrically attached to the microelectronic substrate 540, such that the microelectronic inductor extends at least partially into the microelectronic substrate opening. The microelectronic structure 510 may be attached to various peripheral devices including an input device 550, such as keypad, and a display device 560, such an LCD display. It is understood that the display device 560 may also function as the input device, if the display device 560 is touch sensitive.

It is understood that the subject matter of the present description is not necessarily limited to specific applications illustrated in FIGS. 1-10. The subject matter may be applied to other microelectronic device fabrication applications, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic structure, comprising:
    a microelectronic substrate having an opening therein; and
    a microelectronic package having at least one inductor electrically attached thereto, wherein the microelectronic package is electrically attached to the microelectronic substrate, wherein the at least one inductor extends at least partially into the microelectronic substrate opening, and wherein the microelectronic package comprises a microelectronic device attached to a first surface of an interposer and the at least one inductor attached to a second surface of the interposer.

2. A microelectronic structure, comprising:
    a microelectronic substrate having an opening therein; and
    a microelectronic package having at least one inductor electrically attached thereto, wherein the microelectronic package is electrically attached to the microelectronic substrate, wherein the at least one inductor extends at least partially into the microelectronic substrate opening, and wherein the microelectronic package comprises a microelectronic device attached to a cored interposer.

3. The microelectronic structure of claim 2, wherein the cored interposer comprises a core and a build-up layer.

4. The microelectronic structure of claim 3, wherein the build-up layer abuts a first surface of the core, wherein the microelectronic device is attached to the build-up layer, wherein the core includes a second surface electrically attached to the microelectronic substrate, wherein core includes a platform portion extending from the core second surface, and wherein the at least one inductor is electrically attached to the core platform portion.

5. A microelectronic structure, comprising:
a microelectronic substrate having an opening therein;
a microelectronic package having at least one inductor electrically attached thereto, wherein the microelectronic package is electrically attached to the microelectronic substrate, wherein the at least one inductor extends at least partially into the microelectronic substrate opening; and
at least one secondary microelectronic device attached to the microelectronic package which extends into the microelectronic substrate opening, and wherein the at least one inductor includes at least one opening therein with the at least one secondary microelectronic device residing in the at least one inductor opening.

6. A microelectronic structure, comprising:
a microelectronic substrate having an opening therein;
a microelectronic package having at least one inductor electrically attached thereto, wherein the microelectronic package is electrically attached to the microelectronic substrate, wherein the at least one inductor extends at least partially into the microelectronic substrate opening; and
at least one secondary microelectronic device attached to the microelectronic package which extends into the microelectronic substrate opening, and wherein the at least one inductor includes at least two inductor portions with the at least one secondary microelectronic device residing between the at least two inductor portions.

7. A microelectronic structure, comprising:
a microelectronic substrate comprising a substrate base and a socket, wherein the socket has an opening therein; and
a microelectronic package having at least one inductor electrically attached thereto, wherein the microelectronic package is electrically attached to the microelectronic substrate, wherein the at least one inductor extends at least partially into the microelectronic socket opening, and wherein the microelectronic package comprises a microelectronic device attached to a first surface of an interposer and the at least one inductor attached to a second surface of the interposer.

8. A microelectronic structure, comprising:
a microelectronic substrate comprising a substrate base and a socket, wherein the socket has an opening therein; and
a microelectronic package having at least one inductor electrically attached thereto, wherein the microelectronic package is electrically attached to the microelectronic substrate, wherein the at least one inductor extends at least partially into the microelectronic socket opening, and wherein the microelectronic package comprises a microelectronic device attached to a cored interposer.

9. The microelectronic structure of claim 8, wherein the cored interposer comprises a core and a build-up layer.

10. The microelectronic structure of claim 9, wherein the build-up layer abuts a core first surface, wherein the microelectronic device is attached to the build-up layer, wherein the core includes a second surface electrically attached to the microelectronic substrate, wherein core includes a platform portion extending from the core second surface, and wherein the at least one inductor is electrically attached to the core platform portion.

11. A microelectronic structure, comprising:
a microelectronic substrate comprising a substrate base and a socket, wherein the socket has an opening therein;
a microelectronic package having at least one inductor electrically attached thereto, wherein the microelectronic package is electrically attached to the microelectronic substrate wherein the at least one inductor extends at least partially into the microelectronic socket opening; and
at least one secondary microelectronic device attached to the microelectronic package which extends into the microelectronic substrate opening, and wherein the at least one inductor includes at least one opening therein with the at least one secondary microelectronic device residing in the at least one inductor opening.

12. A microelectronic structure, comprising:
a microelectronic substrate comprising a substrate base and a socket, wherein the socket has an opening therein;
a microelectronic package having at least one inductor electrically attached thereto, wherein the microelectronic package is electrically attached to the microelectronic substrate wherein the at least one inductor extends at least partially into the microelectronic socket opening; and
at least one secondary microelectronic device attached to the microelectronic package which extends into the microelectronic substrate opening, and wherein the at least one inductor includes at least two inductor portions with the at least one secondary microelectronic device residing between the at least two inductor portions.

13. A microelectronic system, comprising:
a housing; and
a microelectronic structure disposed within the housing, comprising:
a microelectronic substrate having an opening therein; and
a microelectronic package having at least one inductor electrically attached thereto, wherein the microelectronic package is electrically attached to the microelectronic substrate, wherein the at least one inductor extends at least partially into the microelectronic substrate opening, and wherein the microelectronic package comprises a microelectronic device attached to a first surface of an interposer and the at least one inductor attached to a second surface of the interposer.

14. A microelectronic system, comprising:
a housing; and
a microelectronic structure disposed within the housing, comprising:

a microelectronic substrate having an opening therein; and a microelectronic package having at least one inductor electrically attached thereto, wherein the microelectronic package is electrically attached to the microelectronic substrate wherein the at least one inductor extends at least partially into the microelectronic substrate opening, and wherein the microelectronic package comprises a microelectronic device attached to cored interposer.

* * * * *